United States Patent [19]

Oda

[11] Patent Number: 5,416,359

[45] Date of Patent: May 16, 1995

[54] SEMICONDUCTOR DEVICE HAVING GOLD WIRING LAYER PROVIDED WITH A BARRIER METAL LAYER

[75] Inventor: Noriaki Oda, Tokyo, Japan

[73] Assignee: NEC Corporation, Japan

[21] Appl. No.: 60,025

[22] Filed: May 10, 1993

[30] Foreign Application Priority Data

May 27, 1992 [JP] Japan .................................. 4-134555

[51] Int. Cl.$^6$ ..................... H01L 23/48; H01L 29/44; H01L 29/54; H01L 29/60
[52] U.S. Cl. .......................... 257/751; 257/750; 257/763; 257/764; 257/767; 257/768; 257/769
[58] Field of Search ............... 257/734, 750, 751, 752, 257/763, 764, 768, 769, 770, 758, 759, 767

[56] References Cited

U.S. PATENT DOCUMENTS

| | | | |
|---|---|---|---|
| 3,507,756 | 4/1970 | Wenger | 257/763 |
| 4,164,461 | 8/1979 | Schilling | 257/763 |

*Primary Examiner*—William D. Larkins
*Attorney, Agent, or Firm*—Laff, Whitesel, Conte & Saret, Ltd.

[57] ABSTRACT

A semiconductor device having a gold wiring layer for an element region is disclosed, in which the gold wiring layer is connected to the element region through a barrier metal layer, the barrier metal layer comprising first and second layers each containing titanium and a third layer sandwiched between the first and second layers and made of a selected one from platinum and palladium. The third layer effectively prevents gold in the gold wiring layer from diffusing into the element region and the second layer enhances the adhesion between the gold wiring layer and an insulating film.

9 Claims, 5 Drawing Sheets

SEMICONDUCTOR DEVICE HAVING GOLD WIRING LAYER PROVIDED WITH A BARRIER METAL LAYER

BACKGROUND OF THE INVENTION

The present invention relates to a semiconductor device and, more particularly, to an improvement in such a device having wiring layers made of gold (called hereinafter "gold wiring layers").

Gold wiring layers have low sheet-resistivity and high reliability against the so-called electro-migration and stress-migration as compared to aluminum wiring layers. Accordingly, the gold wiring layers have become essential to such a semiconductor device that is required to operate at a very high speed and to drive a load circuit with a large current. However, gold in the gold wiring layer is easy to diffuse into an element region to thereby destroy a junction of the element region. A barrier metal layer is therefore provided between the gold wiring layer and the element region.

Referring to FIG. 5, a semiconductor device according to a prior art includes an N-type diffusion 13 region as the element region, which is selectively formed in a P-type substrate 1. Formed on the substrate 1 is an inorganic insulating film 3a which in turn has a contact hole 2 to expose a part of the diffusion region 13. A platinum-silicide layer 10 is formed at the exposed part of the diffusion region 13 to reduce a contact resistance. A plurality of gold wiring layers 4a–7a at a first-level in a multi-level wiring structure (i.e., a plurality of first-level gold wiring layers) are formed on the insulating film 3a. The gold layer 7a is provided as a current path to form the gold layer 4a by the plating method. The right-hand wiring layer 4a–7a is connected to the diffusion region 13 through the contact hole 2. As mentioned hereinbefore, a barrier layer 5a made of titanium-tungsten alloy is formed between the gold wiring layer 4a–7a and the silicide layer 10.

This device further includes an inter-layer insulating layer formed over the entire surface, which is composed of an inorganic insulating film 3b, an inorganic spin-on insulating film 8a, an inorganic insulating film 3c and an inorganic spin-on insulating film 8b formed in that order. The spin-on insulating film 8a and 8b are provided to fill hollows to even out the inter-layer insulating layer. A contact hole 9 is selectively formed in the inter-layer insulating film to expose a part of the left-hand gold wiring layer 4a–7a. The left-hand wiring layer is thus connected via the contact hole 9 to a gold wiring layer 4b–7b at a second level in the multi-level wiring structure (i.e., a second-level gold wiring layer). Similarly to the first-level wiring layer, the gold layer 7b serves as a current path to form the gold layer 4b by the plating method, and a barrier metal layer 5c made of titanium-tungsten alloy. An inorganic insulating film 3e is formed on the second-level wiring layer to protect the surface thereof.

Turning to FIGS. 6 and 7, there are illustrated semiconductor devices according to other prior arts, in which the same constituents as those shown in FIG. 5 are denoted by the same reference numerals to omit further description thereof. In these devices, a platinum layer 6b and a palladium layer 12b are employed as a current path for forming the gold layers 4a and 4b by the plating method.

Referring to FIG. 8, a semiconductor device according to still another prior art employs tungsten layers 11a and 11b to fill the contact holes 2 and 9, respectively. The remaining constituents are the same as those shown in FIG. 5 and therefore the description thereof is omitted.

Thus, various types of semiconductor devices having the gold wiring layers are proposed or put into practical use; however, each of such devices has a drawback indicated below:

In the device shown in FIG. 5, although titanium in the alloy layer 5a diffuses into the gold layer 4a and then appears on the surface of thereof to thereby enhance the adhesion between the gold wiring layer 4a and the inter-layer insulating layer, the titanium-tungsten layer 5a has an insufficient barrier effect against gold. For this reason, gold in the gold wiring layer 4a–7a may diffuse into the region 13 through the barrier layer 5a in the heat treatment at about 400° C. for enhancing the so-called ohmic contact, so that the PN junction between the region 13 and substrate 1 is finally destroyed.

In the device shown in FIG. 6, on the other hand, the platinum layer 6b formed on the titanium-tungsten layer 5a has a superior barrier effect against gold to prevent gold from diffusing into the region 13. However, platinum in the layer 6b in turn diffuses into the gold layer 4a and moreover the platinum layer 6b prevents titanium form diffusing into the gold layer 4a. For this reason, the adhesion between the gold layer 4a and the inter-layer insulating layer is deteriorated as compared to the device of FIG. 1. Similar drawback occurs in the device shown in FIG. 7, since the palladium layer 12b is substantially equal in characteristics to the platinum layer 6b.

In the device shown in FIG. 8, the tungsten layer 11a has an insufficient barrier effect against gold, similarly to the titanium layer.

SUMMARY OF THE INVENTION

It is therefore an object of the present invention to provide an improved semiconductor device having gold wiring layers.

It is another object of the present invention to provide a semiconductor device having gold wiring layers in which gold is prevented effectively from diffusing into an element region with enhancing an adhesion between the gold wiring layer and an insulating film formed thereon.

It is still another object of the present invention to provide a semiconductor device having a gold wiring layer connected to an element region through an improved barrier metal layer.

A semiconductor device according to the present invention comprises a semiconductor substrate, an element region formed selectively in the substrate, an insulating film covering the element region and the substrate and having a contact hole exposing a part of the element region, a gold wiring layer electrically connected to the element region through the contact hole, and a barrier metal layer provided between the gold wiring layer and the part of the element region, the barrier metal layer including first and second layers each containing titanium and a third layer inserted between the first and second layers and made of a selected one of platinum and palladium.

Thus, the third layer operates to effectively prevent gold from diffusing into the element region, and titanium contained in the second layer diffuses into the gold wiring layer to enhance the adhesion between the gold wiring layer and another insulating layer formed thereon. The second layer also has a function of preventing platinum or palladium in the third layer from diffusing into the gold wiring layer. The first layer strengthens the electrical connection between the element region and the third layer.

BRIEF DESCRIPTION OF THE DRAWINGS

The above and other objects, advantages and features of the present invention will be more apparent from the following description taken in conjunction with the accompanying drawings, in which.

DETAILED DESCRIPTION OF THE INVENTION

Figure 1:
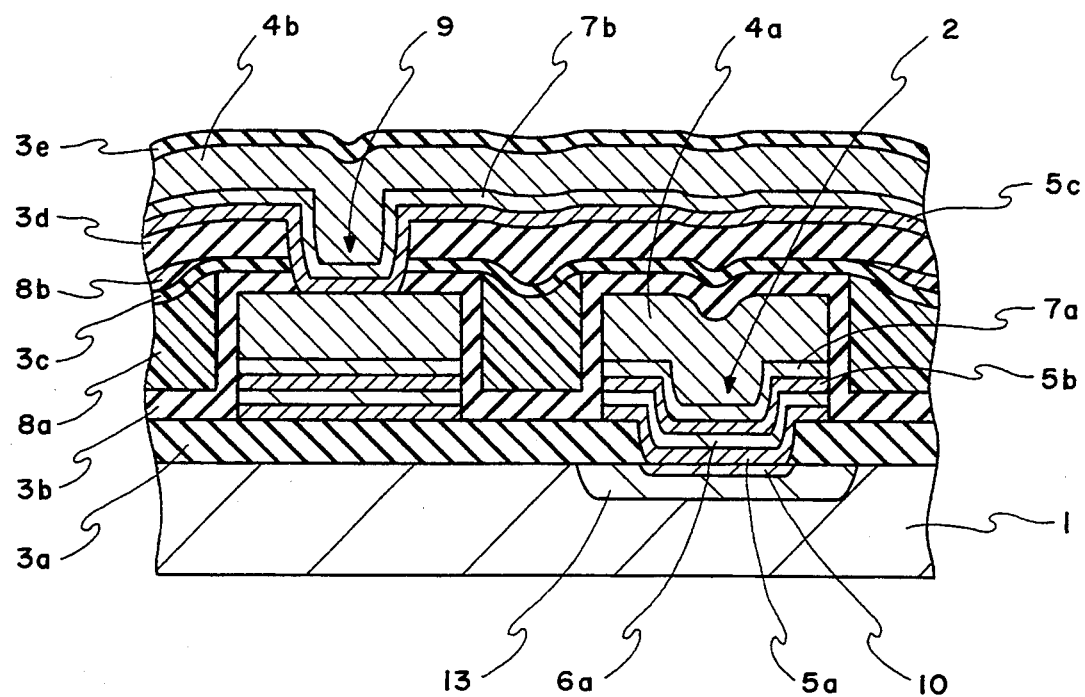
FIG. 1 is a cross sectional view illustrating a semiconductor device according to an embodiment of the present invention.

Referring now to FIG. 1, a semiconductor device according to an embodiment of the present invention includes a P-type semiconductor substrate 1 in which an N-type diffusion region 13 is selectively formed. The diffusion region 13 has a platinum-silicide layer 10 at a surface portion thereof. An inorganic insulating film 3a of about 800 nm in thick is formed to cover the substrate 1 and the region 13 and has a contact hole 2 having 0.8 micrometers in diameter to expose a part of the silicide layer 10. Formed in the insulating film 3a are a plurality of first-level gold wiring layers 4a-7a (two wiring layers being shown in the drawing). The gold layer 7a serves as a current path to form the gold layer 4a by the plating method. The right-hand wiring layer is electrically connected to the diffusion region 13 through the contact hole 2.

A barrier metal layer is provided between the gold wiring layer 4a-7a and the region 13. In accordance with the present invention, this barrier metal layer comprises a titanium-tungsten alloy layer 5a, a platinum layer 6a and a titanium-tungsten layer 5b formed in that order. The layer 5a is in contact with the silicide layer 10 and the layer 5b is in contact with the gold layer 7a.

An inter-layer insulating layer is formed over the entire surface, which is composed of an inorganic insulating film 3b, an inorganic spin-on insulating film 8a, an inorganic insulating film 3c, an inorganic spin-on insulating film 8b and an inorganic insulating film 3d formed in that order. These films are made of silicon oxide, for example. The spin-on insulating films 8a and 8b fill hollows to even the inter-layer insulating layer. A through hole 9 is selectively formed in the insulating layer to expose a part of the left-hand gold wiring layer 4a-7a. A second-level gold wiring layer 4b-7b is formed on the inter-layer insulating layer with an electrical connection to the first-level gold wiring layer via the through hole 9. The gold layer 7b functions as a current path to form the gold layer 4b by the plating method. Formed between the first-level and second-level gold wiring layers at the through hole 9 is a titanium-tungsten layer 5c.

Although the aspect ratio of the contact hole 2 is one because the insulating film 3a is 800 nm in thick and the contact hole is 0.8 micrometers in diameter, it is preferable in the view of the step coverage that the maximum values of the layers 5a, 6a and 5b in thickness are designed to be 100 nm, 60 nm and 100 nm, respectively.

Figure 2A:
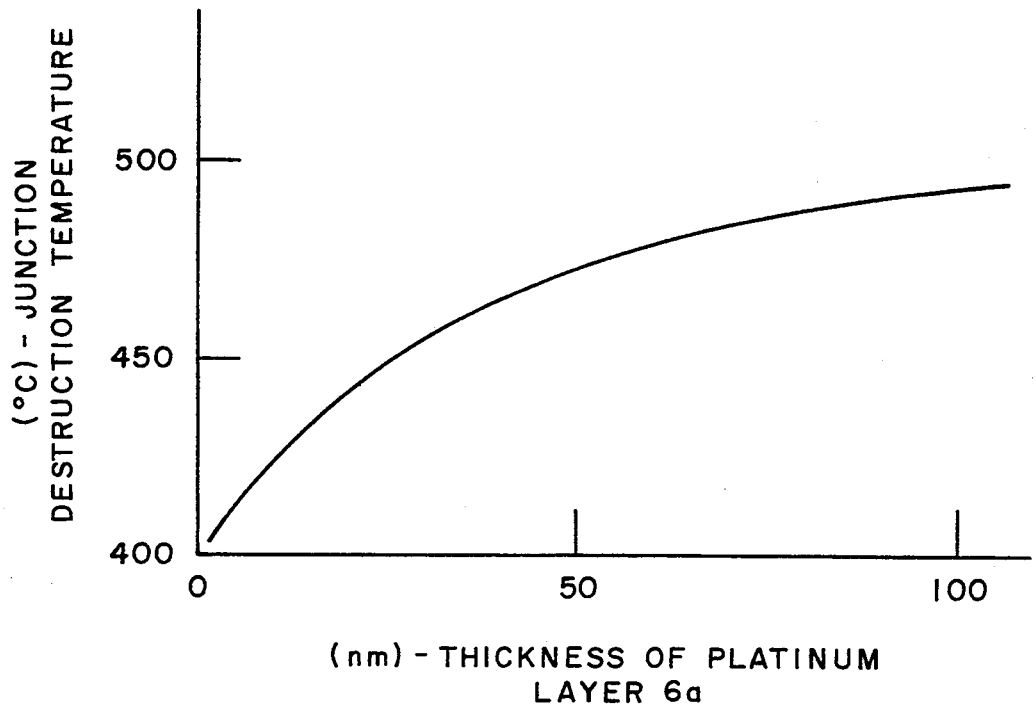
FIGS. 2a and 2b are graphs for explaining the minimum values of metal layers 6a and 5b shown in FIG. 1, respectively.

In the device thus constructed, the platinum layer 6a serves as a sufficient barrier against gold and thus effectively prevents gold in the wiring layer 4a-7a from diffusing into the region 13 even when the heat treatment is carried out at 400° C. The PN junction between the region 13 and the substrate 1 is thereby free from the destruction. Refer here to FIG. 2a which represents the destruction temperature of the junction to the thickness of the platinum layer 6a. It is understood from FIG. 2 that the platinum layer 6a should have 10 nm or more in thickness in order to prevent the junction destruction against the heat treatment at about 420° C.

Figure 2B:
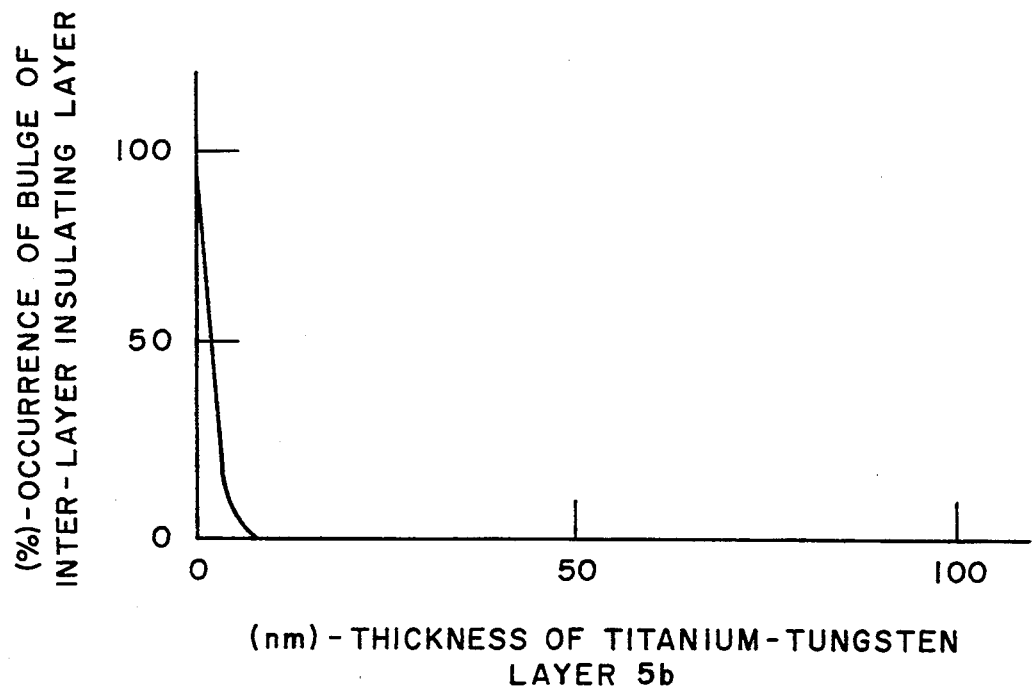
Figure 6:
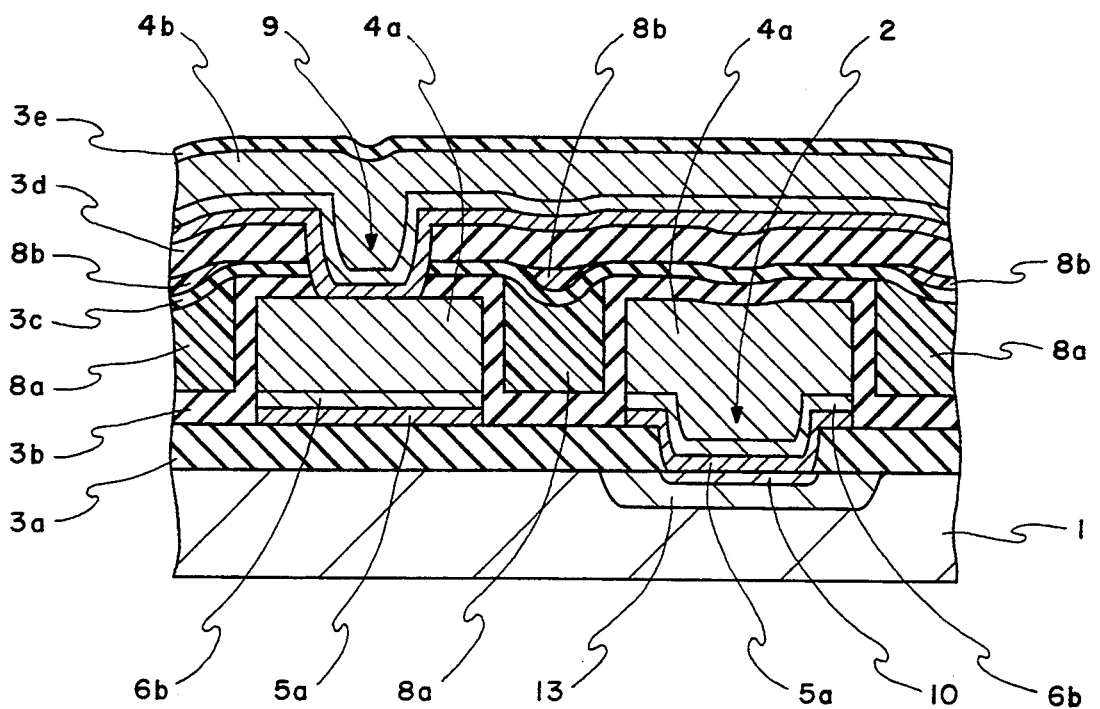
FIG. 6 is a cross sectional view illustrating a semiconductor device according to another prior art.
Figure 7:
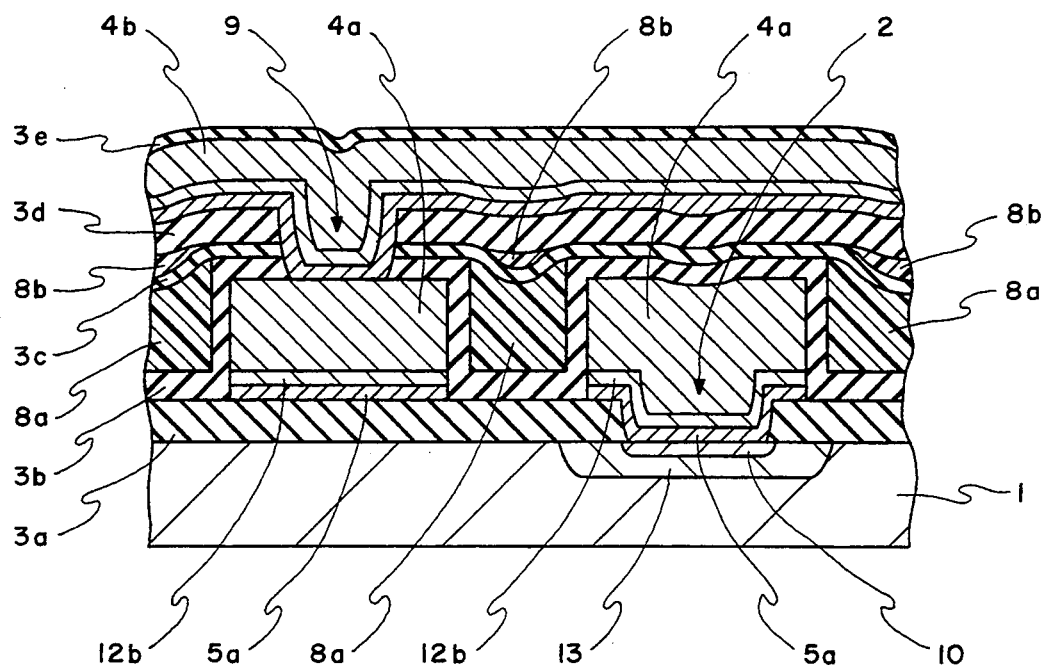
FIG. 7 is a cross sectional view illustrating a semiconductor device according to still another prior art.
Figure 8:
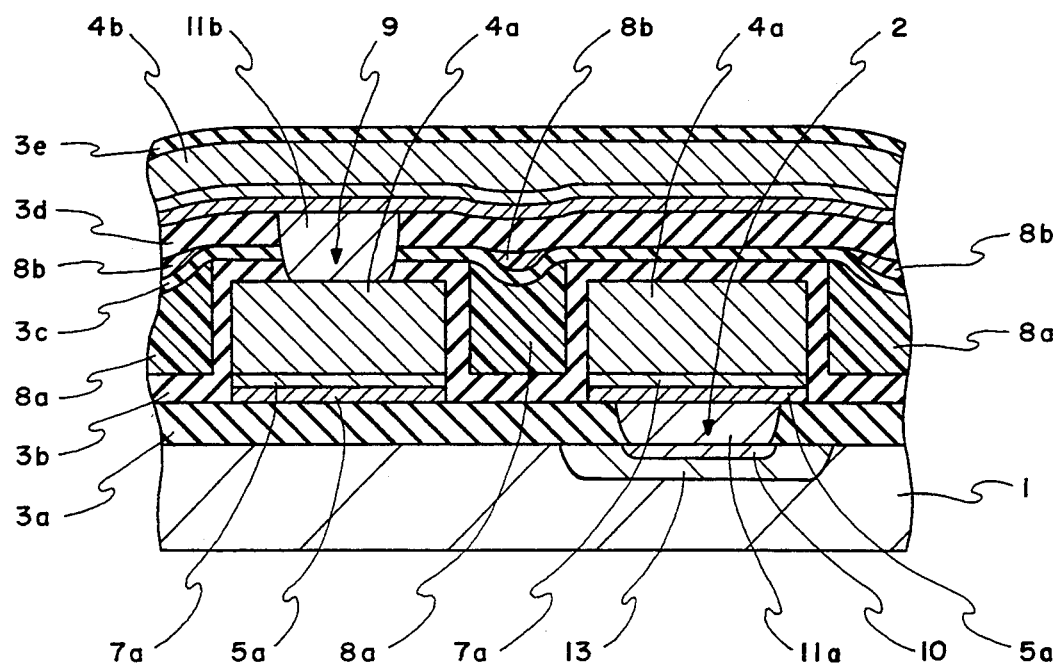
FIG. 8 is a cross sectional view illustrating a semiconductor device according to further another prior art.

Turning back to FIG. 1, the platinum layer 6a is sandwiched between the titanium-tungsten layers 5a and 5b, and hence platinum in the layer 6a is prevented from diffusing into the gold layer 4a or the region 13. On the other hand, the titanium-tungsten layer 5b is in direct contact with the gold layer 4a-7a, and therefore titanium in the layer 5d diffuses into the gold layer 4a-7a and appears on the surface thereof. The adhesion between the gold layer 4a and the inter-layer insulating film is thereby enhanced. The deterioration in adhesion and the bulge of the inter-layer insulating layer, which would be otherwise unavoidable in the devices shown in FIGS. 6 and 7, do not occur. Turning to FIG. 2b which represents the occurrence of the bulge of the insulating layer to the thickness of the titanium-tungsten layer 5b, it is understood that the layer 5b should have at least 10 nm or more in thick.

In the above embodiment, the titanium-tungsten layer 5a may be replaced with a multi-level metal layer comprising a titanium layer at first-level and a titanium-nitride layer at a second-level. Similarly, the titanium-tungsten layer 5b may be replaced with a single titanium layer, a single titanium nitride layer or a multi-level metal layer including those two layers.

Figure 3:
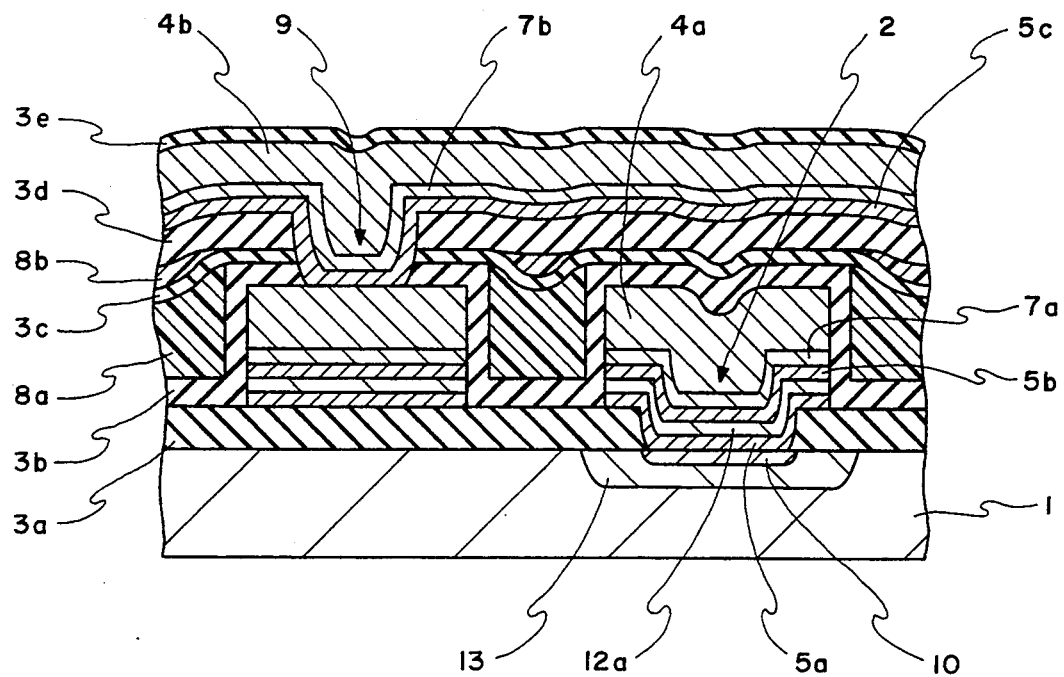
FIG. 3 is a cross sectional view illustrating a semiconductor device according to another embodiment of the present invention.

Referring to FIG. 3, a semiconductor device according to another embodiment of the present invention employs a palladium layer 12a in place of the platinum layer 6a shown in FIG. 1. The other constituents are the same as those shown in FIG. 1 and the further description thereof will be omitted by denoting the same reference numerals. Also in this device, the substantial same effects as the device of FIG. 1 are obtained.

Figure 4:
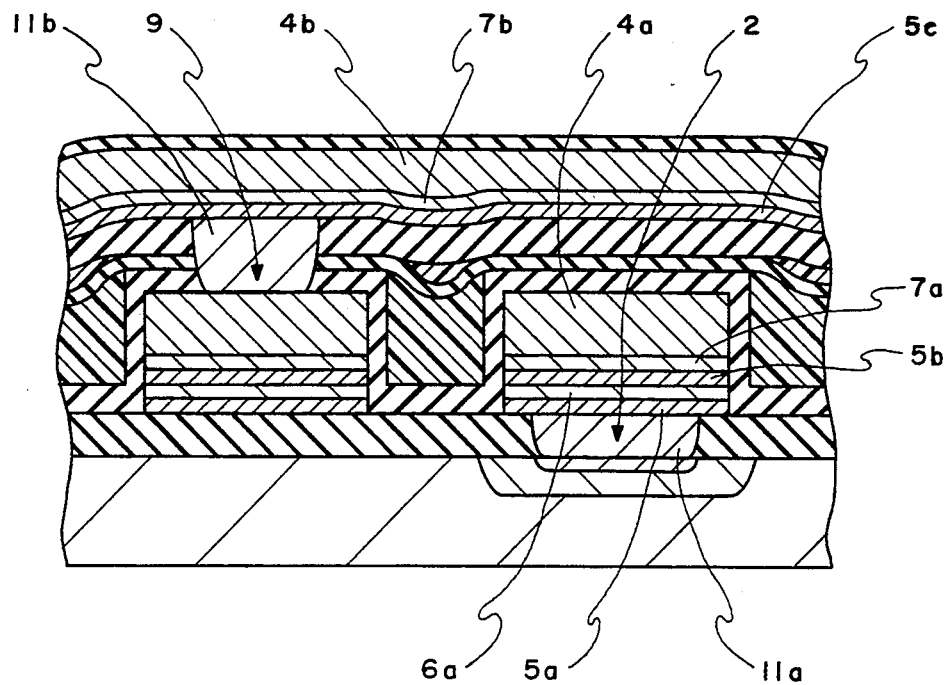
FIG. 4 is a cross sectional view illustrating a semiconductor device according to skill another embodiment of the present invention.
Figure 5:
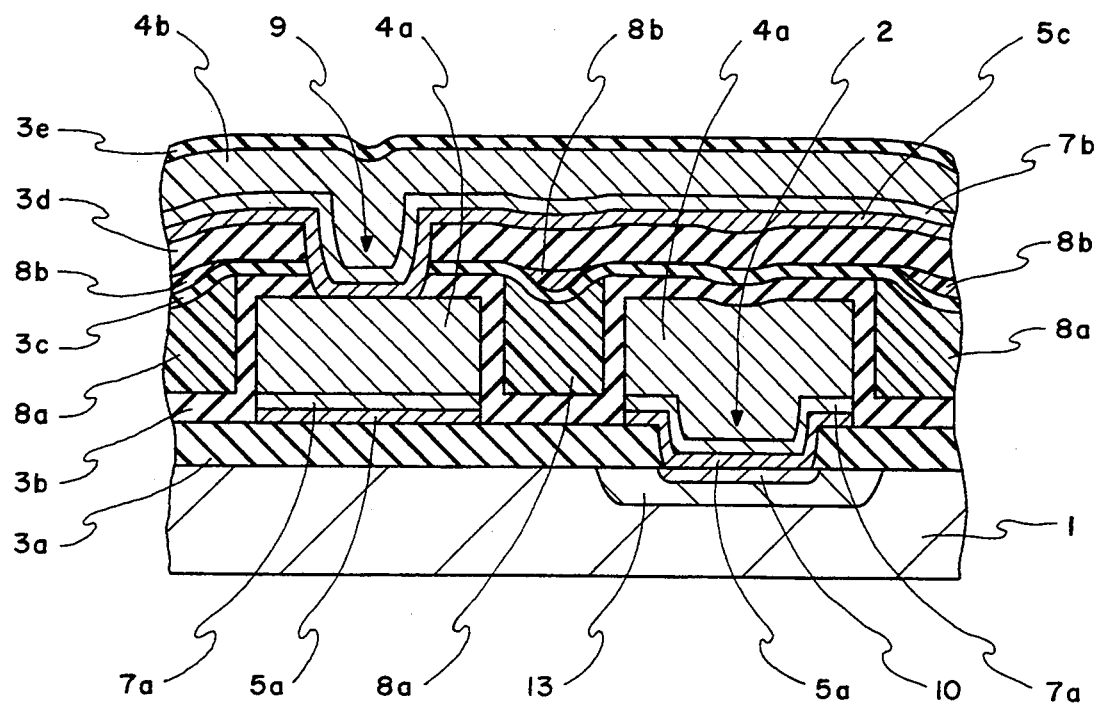
FIG. 5 is a cross sectional view illustrating a semiconductor device according to prior art.

Turning to FIG. 4 which represents still another embodiment of the present invention, this device is different from that of FIG. 1 only in that the contact hole 2a and the through hole 9 are filled with tungsten layers 11a and 11b, respectively. The platinum layer 6a attains the same effects as the device of FIG. 1.

As described above, the present invention provides a semiconductor device having gold wiring layers in which the junction of an element region is free from destruction with enhancing the adhesion between the gold wiring layers and the insulating layer formed thereon.

It is apparent that the present invention is not limited to the above embodiments but may be modified and changed without departing from the scope and spirit of the invention.

What is claimed is:

1. A semiconductor device comprising a semiconductor substrate, an element region selectively formed in said semiconductor substrate, an insulating film covering said semiconductor substrate and said element region, a contact hole selectively formed in said insulating film to expose a part of said element region, a gold wiring layer formed on said insulating film and electrically connected to said element region through said contact hole, and a barrier metal layer provided between said gold wiring layer and the part of said element region, said barrier metal layer including first and second layers each containing titanium and a third layer sandwiched between said first and second layers and made of a selected one from platinum and palladium.

2. The semiconductor device as claimed in claim 1, wherein said element region has a metal silicide layer selectively formed at a surface portion thereof, said contact region exposing said metal silicide layer, and said first layer being in contact with said metal silicide layer.

3. The semiconductor device as claimed in claim 1, wherein said contact hole is filled with a tungsten layer, said first layer being in contact with said tungsten layer.

4. The semiconductor device as claimed in claim 1, wherein each of said first and second layers is made of titanium-tungsten alloy.

5. The semiconductor device as claimed in claim 1, wherein said first layer is of a multi-level metal structure including a titanium layer at a first-level and a titanium nitride layer at a second-level.

6. The semiconductor device as claimed in claim 5, wherein said second layer comprises a selected one from a single titanium layer, a single titanium nitride layer and a composite layer of a titanium layer and a titanium nitride layer.

7. A semiconductor device comprising a semiconductor substrate including an element region, a first insulating film covering said semiconductor substrate and having a contact hole for said element region, a first metal layer electrically connected to said element region through said contact hole and elongated over said first insulating film, said first metal layer containing titanium, a second metal layer formed on said first metal layer and made of a selected one from platinum and palladium, a third metal layer formed on said second metal layer and containing titanium, a fourth metal layer made of gold and formed on said third layer, said first, second, third and fourth metal layers constituting an electrode wiring for said element region, and a second insulating film covering said electrode wiring and said first insulating layer.

8. The semiconductor device as claimed in claim 7, wherein said contact hole is filled with a tungsten layer, said first metal layer being in contact with said tungsten layer.

9. The semiconductor device as claimed in claim 8, wherein each of said first and third metal layer is made of titanium-tungsten alloy.

* * * * *